United States Patent [19]

Kojima et al.

[11] Patent Number: 4,710,250
[45] Date of Patent: Dec. 1, 1987

[54] METHOD FOR PRODUCING A PACKAGE FOR A SEMICONDUCTOR DEVICE

[75] Inventors: Haruo Kojima, Yokohama; Hidehiko Akasaki, Kawasaki, both of Japan

[73] Assignee: Fujitsu Limited, Kawasaki, Japan

[21] Appl. No.: 809,796

[22] Filed: Feb. 11, 1986

Related U.S. Application Data

[63] Continuation of Ser. No. 439,593, Nov. 5, 1982, abandoned.

[30] Foreign Application Priority Data

Nov. 6, 1981 [JP] Japan .............................. 56-177888

[51] Int. Cl.⁴ .............................................. B32B 31/14
[52] U.S. Cl. .................................... 156/89; 156/250; 156/252; 357/74
[58] Field of Search .................... 156/89, 252, 250; 29/569 R, 576 R, 576 J, 580, 587, 829, 830, 834, 848, 849; 357/80, 68, 74

[56] References Cited

U.S. PATENT DOCUMENTS

| | | | |
|---|---|---|---|
| 3,518,756 | 7/1970 | Bennett et al. | 156/89 |
| 3,770,529 | 11/1973 | Anderson | 156/89 |
| 3,778,686 | 12/1973 | Galvin et al. | 317/234 R |
| 4,007,479 | 2/1977 | Kolwalski | 357/74 |
| 4,066,485 | 1/1978 | Rosnowski et al. | 148/188 |
| 4,288,841 | 9/1981 | Gogal | 357/74 |
| 4,505,806 | 3/1985 | Yamada | 156/89 |

FOREIGN PATENT DOCUMENTS 0022359 1/1981 European Pat. Off. .

0019360 2/1979 Japan .................................. 357/74

OTHER PUBLICATIONS

C. R. Herring et al.: "Chip Carrier with Locating Indicia", Western Electric Technical Digest, Nr. 54, Apr. 1979, pp. 9-10.
Patents Abstracts of Japan, vol. 7, nr. 115 (E-176) (1260), May 19, 1983, European Serarch Report, 12-2-1-84, The Hague.

Primary Examiner—Caleb Weston
Attorney, Agent, or Firm—Staas & Halsey

[57] ABSTRACT

A package for a semiconductor device comprising three laminated ceramic sheets: a first sheet provided with a chip stage on the upper surface thereof, a second sheet provided with a first chip-inserting window for exposing the surface of the chip stage and provided with an internal conductor pattern formed at least on the upper surface thereof; and a third sheet provided with a second window for exposing the first chip-inserting window and for exposing a wire-bonding area located adjacent to the periphery of the first chip-inserting window, characterized in that marks for recognizing the location of the first chip-inserting window are essentially aligned, this alignment being effected in that the first chip-inserting window and marks for recognizing the location of the first chip-inserting window are simultaneously formed with the same mold, the marks for recognizing the location of the first chip-inserting window being formed in the wire-bonding area of the second green sheet.

6 Claims, 6 Drawing Figures

METHOD FOR PRODUCING A PACKAGE FOR A SEMICONDUCTOR DEVICE

This is a continuation of co-pending application Ser. No. 439,593 filed on Nov. 5, 1982, now abandoned.

BACKGROUND OF THE INVENTION

The present invention relates to a package structure for a semiconductor device, particularly a mark structure for recognizing the location of a chip cavity provided in a ceramic package for a semiconductor device.

Recently, there has been a tendency to increase the integration of semiconductor integrated circuits, and, consequently, it has become necessary to enlarge the size of the semiconductor chip.

A semiconductor chip is mounted in a chip cavity of a ceramic package for the semiconductor device. The size of the chip cavity, in turn, is limited by the size of the package. Consequently, it is necessary that the clearance between the chip and the chip cavity be extraordinarily small in a case in which a large scale integrated circuit chip is mounted on a conventional package.

In order to exactly recognize the location of a chip cavity, e.g., by means of a TV camera, marks are generally provided on the ceramic sheet of the package.

Two types of mark structures are known for recognizing the location of a cavity provided in a semiconductor package.

In FIG. 1, marks M are formed within a metallized chip stage 1 on a first sheet $S_1$, in a chip cavity C. This structure can be explained in more detail by referring to FIG. 2. A first window 4 is opened in a second sheet $S_2$, on which an internal conductor pattern 3 is metallized so as to form a wire-bonding area WB. A second window 7 is opened in a third sheet $S_3$. The first window 4 and the second window 7 constitute the chip cavity C. These three ceramic sheets are laminated as green sheets and are fired to form a package for a semiconductor device.

The terms "alignment" and "mal-alignment" described hereinafter refer to the locational relationship between the chip cavity and the marks for recognizing the chip cavity; in other words, to the relationship between the location of the produced marks and the designated location of the marks in respect to the location of the chip cavity, i.e., the window.

In the prior art mark structure, two kinds of mal-alignment are apt to take place. One is due to inappropriate registration in metallizing the chip stage. The other is due to the inappropriate lamination of the second sheet on the first sheet. The amount of mal-alignment of the marks in respect to the first window 4 amounts to ±0.2 mm.

In the second type of mark structure, the marks M are formed within the wire-bonding area WB on the second sheet $S_2$, in the chip cavity C (FIG. 3). The marks M and the internal conductor pattern 3 are printed simultaneously on the second sheet $S_2$. Then, the first window 4 is punched through the second sheet $S_2$. Therefore, due to inappropriate registration between the printing and the punching, the mal-alignment of the marks in respect to the first window 4 amounts to ±0.1 mm.

Thus, the clearance between the chip and the chip cavity is inevitably limited by the amount of mal-alignment, i.e., ±0.1∼0.2 mm.

SUMMARY OF THE INVENTION

Figure 1:
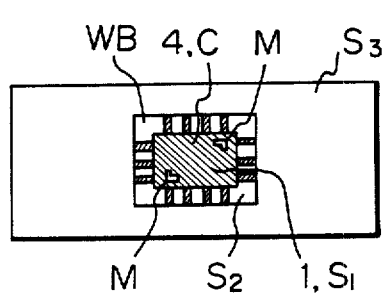
FIG. 1 is a plan view of a conventional package.
Figure 2:
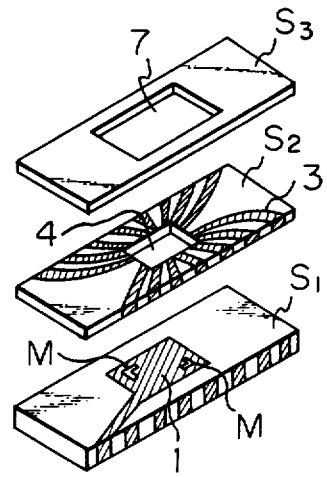
FIG. 2 is an exploded perspective view of the conventional package shown in FIG. 1.
Figure 3:
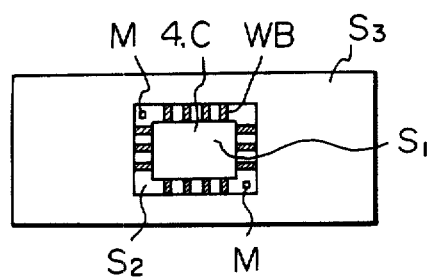
FIG. 3 is a plan view of another conventional package.

It is an object of the present invention to provide a package for mounting as large a chip as possible.

It is another object of the present invention to provide structure for forming marks for recognizing the location of a chip cavity without mal-alignment in respect to the chip cavity.

According to one aspect of the present invention, there is provided a package for a semiconductor device comprising three ceramic sheets which are sequentially laminated, said ceramic sheets consisting of a first ceramic sheet provided with a chip stage on the upper surface thereof; a second ceramic sheet provided with a first chip-inserting window for exposing said chip stage and provided with an internal conductor pattern formed at least on the upper surface thereof; and a third ceramic sheet provided with a second window for exposing said first chip-inserting window and for exposing a portion of said internal conductor pattern as a wire-bonding area located adjacent to the periphery of said first chip-inserting window, characterized in that marks for recognizing the location of said first chip-inserting window are punched or pressed on said second ceramic sheet exposed by said second window and aligned in respect to said first chip-inserting window.

According to another aspect of the present invention, a method for producing a package for semiconductor devices comprising the steps of sequentially laminating three ceramic green sheets and firing the laminated ceramic green sheets. The lamination comprising the steps of; superposing on a first green sheet, provided with a chip stage on the upper surface thereof, a second green sheet provided with a first chip-inserting window, for exposing the surface of the chip stage, and an internal conductor pattern formed on at least, the upper surface thereof; and superposing on the second green sheet a third green sheet provided with a second window for exposing the first chip-inserting window and a wire-bonding area located adjacent to the periphery of the first chip-inserting window. The first chip-inserting window and the marks for recognizing the location of the first chip-inserting window are simultaneously formed with the same mold. The marks for recognizing the location of the first chip-inserting window are formed in the wire-bonding area of the second green sheet.

It is advantageous that the marks be punched through the second sheet. It is advisable that the marks be intaglio pressed on the second sheet. However, it is essential that the marks be punched or pressed at the same time that the first chip-inserting window is punched. Contrary to this, the prior art packages have at least a ±0.1 mm mal-alignment of the marks from the designated location of the marks in respect to the first chip-inserting window. It is convenient if the marks are circular or square.

It is preferable that the marks be located on diagonal corners of the first chip-inserting window. It is convenient if the package is a dual in line type package, a plug in type package, or a leadless chip carrier type package or if it has external leads on one side or on all four sides of the package.

DESCRIPTION OF THE PREFERRED EMBODIMENT

The present invention will be described in detail, with reference to the drawings.

Figure 4:
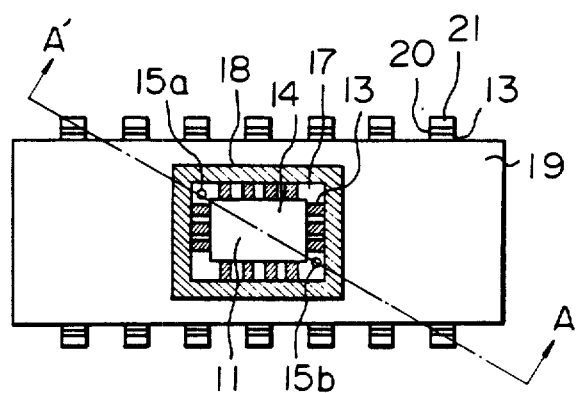
FIG. 4 is a plan view of an embodiment of a package according to the present invention.
Figure 5:
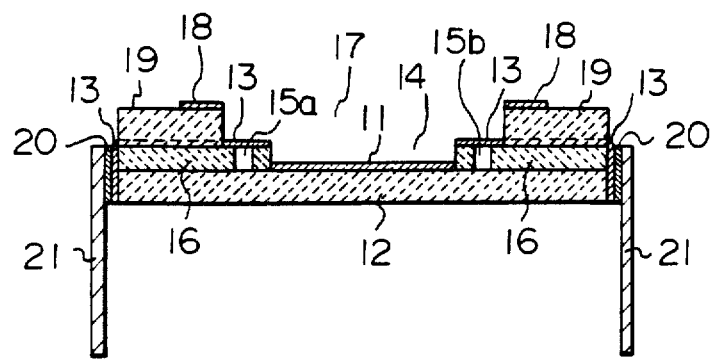
FIG. 5 is a sectional view taken along the arrows "A" and "A'" in FIG. 4.

FIG. 4 is a plan view of a package embodiment according to the present invention. FIG. 5 is a sectional view taken along the arrows "A" and "A'" in FIG. 4. The package comprises three ceramic sheets 12, 16, and 19. The first sheet 12 is provided with a metallized chip stage 11, e.g., of gold. The second sheet 16 is provided with a metallized internal conductor pattern 13, e.g., of gold, a first chip-inserting window 14, and marks 15a and 15b for recognizing the location of the first chip-inserting window 14. The marks 15a and 15b are punched at the same time that the first chip-inserting window 14, which exposes the chip stage 11, is punched, the marks 15a and 15b and the window 14 being punched by the same mold. The third sheet 19 is provided with a cap-brazing frame 18, e.g., of Au-Sn, and a second chip-inserting window 17, which exposes a portion of the internal conductor pattern 13 and the first window 14. This exposed portion of the pattern 13 constitutes a wire-bonding area, which surrounds the first window 14. The cap-brazing frame 18 surrounds the second window 17. The first and the second chip-inserting windows 14 and 17 constitute the chip-cavity, in which a chip is to be mounted. External leads 21 are fixed to a brazing material 20, e.g., silver, and are superposed on the extended portions of the internal conductor pattern 13.

Marks 15a and 15b for recognizing the location of the first window 14 are formed in the wire-bonding area. The exposed surfaces of the external leads 21, the internal conductor pattern 13, and the chip stage 11 are usually plated, e.g., with gold.

Figure 6:
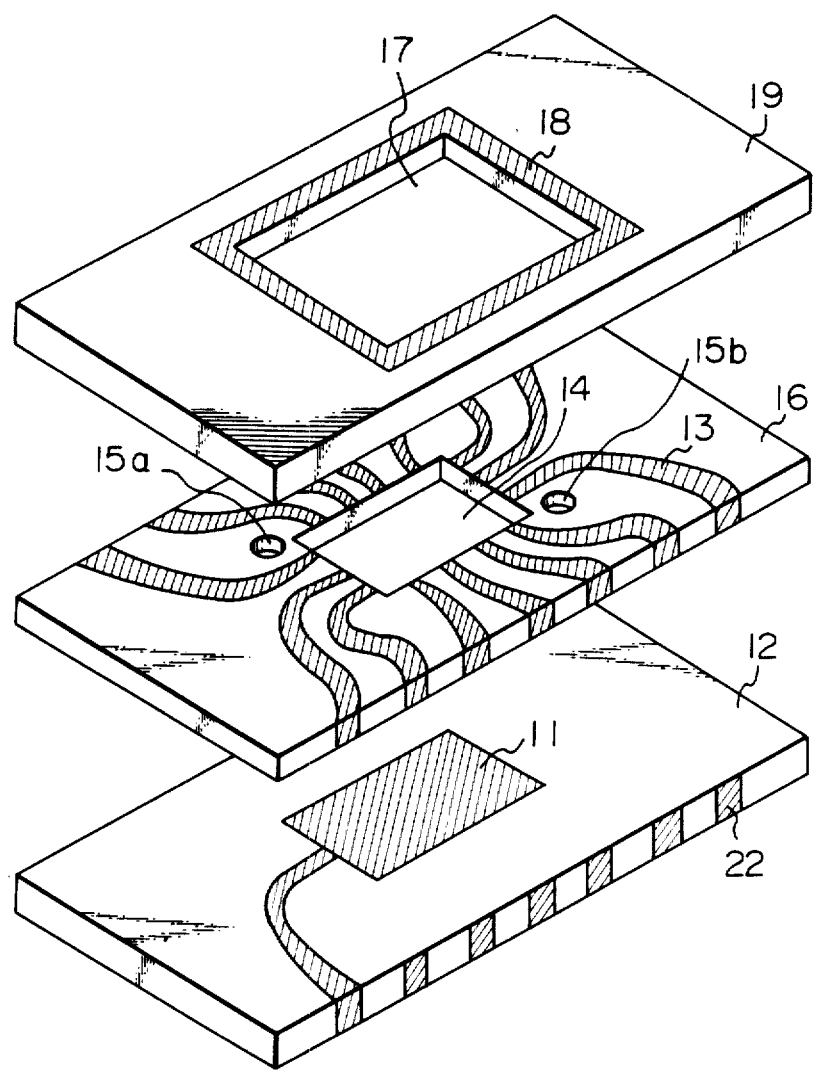
FIG. 6 is an exploded perspective view of the embodiment of the package in FIG. 4.

The structure of the package shown in FIGS. 4 and 5 will be more readily understood from the following description, referring to FIG. 6. As shown in the exploded view, the package for semiconductor devices comprises three ceramic sheets. The first sheet has a conventional structure and is provided with the chip stage 11 and the metallized layer 22 in a conventional manner. The second sheet 16 is provided with the internal conductor pattern 13, the chip-inserting window 14, and the marks 15a and 15b. The window 14 and the marks 15a and 15b are simultaneously punched with the same mold through the second sheet 16. The third sheet 19 is provided with the second chip-inserting window 17 and the cap-brazing frame 18 metallized around the window 17 in a conventional manner.

We claim:

1. A method for producing a package for a semiconductor device by sequentially laminating three ceramic green sheets and firing the laminated ceramic green sheets, the package facilitating the mounting of a semiconductor chip thereon, comprising the steps of:
    (a) providing a first green sheet having a chip stage on the upper surface thereof;
    (b) providing a second green sheet having an internal conductor pattern on at least the upper surface thereof and by using a single mold, simultaneously forming therein, a chip-inserting window and at least two marks, the window being formed in the second green sheet at a predetermined location as required for exposing the surface of the chip stage of the first green sheet when the first and second green sheets are subsequently laminated, and the marks being provided at predetermined, respective positions relative to the location of the first chip-inserting window for subsequent detection and recognition, thereby, of the location of the first chip-inserting window;
    (c) superimposing the second green sheet on the first green sheet and laminating the second green sheet to the first green sheet;
    (d) providing a third green sheet and forming a second chip-inserting window at a predetermined location therein as required, when the third green sheet is subsequently laminated with the first and second laminated green sheets, for exposing the first chip-inserting window, the marks, and a predetermined portion of the internal conductor pattern located adjacent to the periphery of the first chip-inserting window, said exposed, predetermined portion of the internal conductor pattern of said second green sheet functioning as a wire-bonding area, and the predetermined location of the marks being selected so as to form the marks in the wire-bonding area of the second green sheet;
    (e) superimposing the third green sheet on the second green sheet and laminating the third green sheet to the second green sheet;
    (f) firing the laminated creamic green sheets; and
    (g) in preparation for inserting a semiconductor chip through the first and second chip-inserting windows and mounting same on the chip stage of the first sheet, recognizing the location of the first chip-inserting window by means of the marks.

2. A method according to claim 1, wherein said simultaneous forming step (b) comprises the step of punching the marks through the second ceramic green sheet.

3. A method according to claim 1, wherein said simultaneous forming step (b) comprises the step of intaglio forming the marks on the second ceramic green sheet.

4. A method for producing a package for a semiconductor device by sequentially laminating three ceramic green sheets and firing the laminated green sheets, comprising the steps of:
    (a) providing a first green sheet having a chip stage on the upper surface thereof;
    (b) providing a second green sheet having an upper surface and an internal conductor pattern formed at least on the upper surface thereof;
    (c) simultaneously forming a first chip-inserting window and marks for recognizing the location of the first chip-inserting window in the second green sheet with a single mold;
    (d) superimposing the second green sheet on the first green sheet and laminating the second green sheet to the first green sheet;
    (e) providing a third green sheet having a second window;
    (f) superimposing the third green sheet on the second green sheet and laminating the third green sheet to the second green sheet so that the second window exposes a portion of the internal conductor pattern located adjacent to the periphery of the first chip-inserting window, containing the marks, and functioning as a wire-bonding area;

(g) firing the laminated ceramic green sheets; and (h) in preparation for inserting a semiconductor chip through the first and second chip-inserting windows and mounting same on the chip stage of the first sheet, recognizing the location of the first chip-inserting window by means of the marks.

5. A method according to claim 4, wherein said simultaneous forming step (c) comprises the step of punching the marks through the second ceramic green sheet.

6. A method according to claim 4, wherein said simultaneous forming stp (c) comprises the step of intaglio forming the marks in the second ceramic green sheet.

* * * * *

UNITED STATES PATENT AND TRADEMARK OFFICE
CERTIFICATE OF CORRECTION

PATENT NO. : 4,710,250

DATED : December 1, 1987

INVENTOR(S) : Haruo KOJIMA et al.

It is certified that error appears in the above-identified patent and that said Letters Patent is hereby corrected as shown below:

Col. 2, line 19, before "structure" insert --a--.

Col. 4, line 35, change "creamic" to --ceramic--.

Col. 6, line 8, change "stp" to --step--.

Signed and Sealed this

Seventh Day of June, 1988

Attest:

DONALD J. QUIGG

Attesting Officer

Commissioner of Patents and Trademarks